United States Patent
Sen et al.

(10) Patent No.: US 11,261,535 B2
(45) Date of Patent: Mar. 1, 2022

(54) PLATING APPARATUS AND OPERATION METHOD THEREOF

(71) Applicant: PYXIS CF PTE. LTD., Singapore (SG)

(72) Inventors: Amlan Sen, Singapore (SG); Navaneetha Kumaran Baheerathan, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 0 days.

(21) Appl. No.: 16/656,863

(22) Filed: Oct. 18, 2019

(65) Prior Publication Data
US 2020/0299854 A1    Sep. 24, 2020

(30) Foreign Application Priority Data

Mar. 22, 2019 (SG) .............................. 10201902611P
May 10, 2019 (CN) .......................... 201910391509.6

(51) Int. Cl.
| | | |
|---|---|---|
| *C25D 17/10* | (2006.01) | |
| *C25D 17/06* | (2006.01) | |
| *C25D 5/08* | (2006.01) | |
| *C25D 17/02* | (2006.01) | |
| *H01L 21/288* | (2006.01) | |

(52) U.S. Cl.
CPC ............... *C25D 17/06* (2013.01); *C25D 5/08* (2013.01); *C25D 17/02* (2013.01); *H01L 21/2885* (2013.01)

(58) Field of Classification Search
CPC .... C25D 17/001; C25D 17/10; C25D 17/005; C25D 17/06; C25D 17/02; C25D 17/00; C25D 17/08
See application file for complete search history.

(56) References Cited

U.S. PATENT DOCUMENTS

| | | |
|---|---|---|
| 7,727,800 B2 | 6/2010 | Wan et al. |
| 8,633,441 B2 | 1/2014 | Wang et al. |
| 2002/0027080 A1 | 3/2002 | Yoshioka et al. |
| 2004/0245112 A1 | 12/2004 | Sekimoto et al. |

(Continued)

FOREIGN PATENT DOCUMENTS

| | | |
|---|---|---|
| CN | 1572911 A | 2/2005 |
| TW | I281516 | 5/2007 |

OTHER PUBLICATIONS

U.S. Appl. No. 16/565,589, filed Sep. 10, 2019, Amlan Sen.

(Continued)

*Primary Examiner* — Zulmariam Mendez
(74) *Attorney, Agent, or Firm* — Daniel F. Nesbitt; Hasse & Nesbitt LLC

(57) ABSTRACT

A plating apparatus and an operation method thereof are provided. The plating apparatus includes: a tank body including at least one side wall, the at least one side wall being provided with an opening extending from the inside to the outside of the tank body, and the tank body being configured to accommodate a plating solution; and a fixing device configured to fix the substrate at the opening of the side wall. The operation method of the plating apparatus includes: placing the substrate on an outer side of the side wall and at the position of the opening, and operating the fixing device to fix the substrate; and performing plating treatment on the substrate.

20 Claims, 9 Drawing Sheets

(56) References Cited

U.S. PATENT DOCUMENTS

2006/0070883 A1\* 4/2006 Bejan .................. C25D 17/004
 205/118
2006/0113185 A1\* 6/2006 Kuriyama ........... C23C 18/1628
 204/275.1

OTHER PUBLICATIONS

U.S. Appl. No. 16/722,438, filed Dec. 20, 2019, Amlan Sen.
Notification Letter of Review Opinion, dated Feb. 4, 2021 by the Taiwan Intellectual Property Office, in related Taiwan Application No. 108127537 filed Aug. 2, 2019 (6 pages) with Google machine translation (3 pages).
First Office Action, dated Jun. 9, 2021 by the China National Intellectual Property Administration, in related Chinese Application No. 201910391509.6 filed May 10, 2019 (8 pages) with Google machine translation (7 pages).

\* cited by examiner

PLATING APPARATUS AND OPERATION METHOD THEREOF

TECHNICAL FIELD

The present disclosure relates to a plating apparatus and an operation method thereof.

BACKGROUND

Plating is a process in which a certain metal surface is plated with a thin layer of other metal or alloy using electrolysis principle. Since the introduction of plating technology, it has been widely used in different industrial fields. Starting from the early aesthetic-oriented decorative application, such as producing decorative and protective surface layers on mechanical products, the plating technology has gradually developed to be applied in high-tech industry at present, such as the chip package process. Plating technology has become an indispensable technology in the semiconductor microelectronic industry.

In general, the conventional plating technology typically provides a plating tank which accommodates a plating solution. In the plating process, a substrate to be plated is used as a cathode, and plated metal or other insoluble material is used as an anode; the cathode and the anode are placed in the plating tank, and direct current voltage is supplied between the two electrodes; and a surface of the substrate to be plated is reduced to form a coating due to the electrode reaction.

SUMMARY

The present disclosure provides a plating apparatus and an operation method thereof. The plating apparatus has a simple structure and convenient operation, which helps shortening the operation time of the substrate mounting process, improves the production efficiency of semiconductor package, and is particularly suitable for panel level semiconductor package.

A brief summary of the present disclosure is presented below to provide a basic understanding of some aspects of the present disclosure. The content of the present disclosure is not an extensive overview of the present disclosure and is not intended to identify key or critical elements of the present disclosure or the scope of the present disclosure. The following content of the present disclosure reveals some concepts of the present disclosure in a simplified form as a prelude to the specific embodiments provided below.

The present disclosure proposes plating apparatus for performing plating treatment on a substrate, comprising: a tank body comprising at least one side wall, the at least one side wall being provided with an opening extending from the inside to the outside of the tank body, the tank body being configured to accommodate a plating solution; and a fixing device configured to fix the substrate at the opening of the side wall.

According to one embodiment of the present disclosure, the fixing device is disposed at the outside of the tank body, so that the fixing device could be operated easily from the outside of the tank body.

According to one embodiment of the present disclosure, a substrate mounting plate fixed on an outer side of the side wall, wherein the substrate mounting plate is provided with a hole and a substrate mounting area arranged around the hole; and a position of the hole of the substrate mounting plate corresponds to a position of the opening of the side wall.

According to one embodiment of the present disclosure, the fixing device is disposed on the substrate mounting plate.

According to one embodiment of the present disclosure, the fixing device comprises two or more clamping pieces arranged on a periphery of the hole of the substrate mounting plate.

Thus, the fixing device can be constructed in a convenient and lightweight manner, and the substrate is fixed on the substrate mounting plate in a fluid seal manner.

At least one part of the clamping piece can move between an extended position and a retracted position at the retracted position of the clamping plate, the substrate can pass through the space above the substrate mounting area without hindrance, thereby allowing convenient operation of placing the substrate on the substrate mounting plate or removing the substrate from the substrate mounting plate.

According to an advantageous embodiment of the present disclosure, the at least one clamping piece comprises a plurality of clamping pieces; and the plurality of clamping pieces are arranged on a periphery of the hole of the substrate mounting plate.

According to a further advantageous embodiment of the present disclosure, the fixing device comprises a first driving mechanism and a second driving mechanism; the first driving mechanism is configured to drive at least a part of the clamping piece along a first direction, so that the at least a part of the clamping piece moves from the side of the substrate mounting area away from the hole to the substrate mounting area, the first direction is parallel to the substrate mounting plate and directed from the side of the substrate mounting area away from the hole to the substrate mounting area; and the second driving mechanism is configured to drive at least a part of the clamping piece along a second direction perpendicular to the substrate mounting plate, so that the at least a part of the clamping piece applies pressure towards the substrate mounting area.

The first driving mechanisms and the second driving mechanism of the plurality of clamping pieces can be connected to a control module, and the control module can respond to an instruction of the operator and simultaneously operate the plurality of clamping pieces. This automated implementation significantly reduces the fixed operation time and reduces the production cost. In addition, the fixing operation by the driving mechanisms is highly reproducible and uniform compared to the manual operation, thereby ensuring the reliability of the fixing operation and the sealing of substrate mounting.

According to one embodiment of the present disclosure, the clamping piece comprises a supporting plate and a clamping plate, the supporting plate comprises a receiving slot; the clamping plate is inserted into the receiving slot and capable of sliding in the receiving slot along the first direction; the first driving mechanism is configured to drive the clamping plate along the first direction, so that the clamping plate extends out of the receiving slot and moves from the side of the substrate mounting area away from the hole to the substrate mounting area; and the second driving mechanism is configured to drive the clamping plate in the second direction, so that the clamping plate applies pressure towards the substrate mounting area.

According to one embodiment of the present disclosure, the clamping piece comprises a connecting plate disposed on the supporting plate and fixed to the first driving mechanism, the connecting plate comprises a cam slot extending in a direction between the first direction and the third direction to form an angle greater than 0° and less than 90° with the first direction, and a protrusion is fixed on the clamping plate and passes through the supporting plate to cooperate with the cam slot; and wherein the first driving mechanism is configured to drive the connecting plate along a third direction which is parallel to the substrate mounting plate and perpendicular to the first direction, so that the protrusion moves in the cam slot along an extension direction of the cam slot, and the clamping plate slides in the receiving slot of the supporting plate along the first direction.

According to one embodiment of the present disclosure, the fixing device further comprises a pivotal shaft connected to a middle part of the supporting plate; the second driving mechanism is configured to drive an end portion of the supporting plate away from the hole in the first direction to move away from the substrate mounting plate along the second direction, so that the supporting plate rotates about the pivotal shaft, an end portion of the supporting plate close to the hole in the first direction moves towards the substrate mounting plate along the second direction, and the clamping plate applies the pressure towards the substrate mounting area.

According to one embodiment of the present disclosure, the clamping plate comprises a cantilever element and a clamping end, the cantilever element is configured to be inserted into the receiving slot of the supporting plate; and the clamping end extends from an end of the cantilever element towards the substrate mounting plate and is configured to apply the pressure towards the substrate mounting plate; and in a case that the supporting plate is parallel to the substrate mounting plate, a first distance between the pivotal shaft and the second driving mechanism measured in the first direction is greater than a second distance between the pivotal shaft and the clamping plate measured in the first direction.

According to one embodiment of the present disclosure, the first distance is twice the second distance.

According to one embodiment of the present disclosure, a guide rail extending along the third direction is disposed on the supporting plate and configured to guide the connecting plate to move on the supporting plate along the third direction.

According to one embodiment of the present disclosure, the tank body comprises a plurality of side walls; and the opening is disposed on at least two of the plurality of side walls. Thus, plating treatment on a plurality of substrates to be plated can be performed simultaneously, thereby obtaining several-times the efficiency of plating treatment.

According to one embodiment of the present disclosure, the plating apparatus further comprises a substrate stopper which is configured to move from the outside of the opening to a middle part of the opening.

The substrate stopper can comprise a supporting stand connected to the substrate mounting plate and an arm roughly parallel to the substrate mounting plate. The arm can rotate between an idle position outside of the opening and a stop position above the opening in the plane parallel to the substrate mounting plat. Before plating treatment, the arm can be disposed at the idle position. In this case, the stop portion is disposed on the outer side of the opening of the side wall, so as to mount and fix the substrate on the substrate mounting plate. During plating treatment, the arm can be rotated to the stop position. In this case, the stop portion is disposed in the middle part of the opening of the side wall and stops on the outer side of the substrate to prevent the deformation of the substrate under the pressure of the plating solution in the tank body.

According to an advantageous embodiment of the present disclosure, the plating apparatus further comprises a plating solution drive device disposed in the tank body and facing the opening, and the plating solution drive device is configured to drive the plating solution to flow towards the opening.

Thus, the plating solution near the substrate can be rapidly replenished; the parameters such as temperature, concentration, pH and the like of the plating solution in the vicinity of the substrate remains constant; and the chemical composition of the plating solution uniformly dispersed. Therefore, the coating deposited on the substrate can be formed in uniform thickness to improve the yield of plating treatment and reduce the production cost.

According to one embodiment of the present disclosure, the plating solution drive device is mounted on the side wall provided with the opening. Due to this configuration, the movement process of the plating solution drive device can be implemented in a more stable manner, and the distance from the plating solution drive device to the substrate to be plated can be accurately controlled.

According to one embodiment of the present disclosure, a distance between the plating solution drive device and the side wall provided with the opening is in a range from 2 mm to 4 mm. The placement of the plating solution drive device close to the side wall provided with the opening allows obtaining a coating with more uniform thickness.

According to one embodiment of the present disclosure, the plating solution drive device comprises a plurality of blades arranged and configured to move in a plane parallel to the side wall provided with the opening.

According to one embodiment of the present disclosure, the plating solution drive device comprises a plurality of nozzles arranged in an array and configured to move in a plane parallel to the side wall provided with the opening, and the plurality of nozzles are further configured to spray the plating solution towards the side wall provided with the opening.

According to another embodiment of the present disclosure, a distance between adjacent nozzles is in a range from 1 mm to 5 mm; and the nozzle has a bore diameter in a range from 0.5 mm to 1 mm.

According to one embodiment of the present disclosure, the plating apparatus further comprises at least one sealing element disposed in at least one of the following areas: an area of the substrate mounting plate around the hole or an area of the side wall, provided with the opening, around the opening.

According to one embodiment of the present disclosure, a position at which the clamping end applies the pressure towards the substrate mounting plate at least partially overlaps with a position of the sealing element in the direction perpendicular to the substrate mounting plate. Thus, the sealing effect of the sealing element may be improved due to the pressure applied to the sealing element, thereby preventing the leakage of the plating solution in the plating process.

According to one embodiment of the present disclosure, the clamping plate comprises a plurality of clamping ends, and positions at which the plurality of clamping ends apply pressure towards the substrate mounting plate are at least partially overlapped with the position of the sealing element in the direction perpendicular to the substrate mounting plate. Thus, the sealing effect of the sealing element may be further improved.

According to one embodiment of the present disclosure, the substrate mounting area is provided with electrical contacts configured to be electrically connected with the substrate.

According to one embodiment of the present disclosure, the electrical contacts are distributed on two opposite sides or four sides of the hole of the substrate mounting plate.

According to one embodiment of the present disclosure, a number of the electrical contacts distributed on each side of the hole is four or more.

According to an advantageous embodiment of the present disclosure, the plating apparatus further comprises a resistance measuring device electrically connected to the electrical contacts of the substrate mounting area.

After the substrate is mounted on the substrate mounting plate by utilization of the fixing device, the resistance measuring device may be utilized to measure the contact resistance between the substrate and the electrical contact, so as to determine whether the connection status between the substrate and the electrical contact is good. For instance, the resistance measuring device is electrically connected to four electrical contacts disposed on one side. Thus, the resistance measuring device may measure the contact resistance between the substrate and the electrical contacts by utilization of the four-point method.

According to one embodiment of the present disclosure, the plating apparatus further comprises an anode disposed in the tank body.

According to one embodiment of the present disclosure, the plating apparatus further comprises a power supply device respectively electrically connected with the anode and the electrical contacts.

The present disclosure further proposes an operation method of the abovementioned plating apparatus, comprising: placing the substrate on the outer side of the side wall and at the position of the opening, and operating the fixing device to fix the substrate; and performing plating treatment on the substrate.

According to one embodiment of the present disclosure, placing the substrate on an outer side of the side wall and at a position of the opening, and operating the fixing device to fix the substrate; and performing plating treatment on the substrate.

According to one embodiment of the present disclosure, placing the substrate on the opening of the side wall and operating the fixing device to fix the substrate comprises: measuring by the resistance measuring device a contact resistance between the substrate and the electrical contacts, and determining a connection status of the substrate and the electrical contacts.

According to one embodiment of the present disclosure, performing plating treatment on the substrate comprises: injecting the plating solution into the tank body, so that the plating solution contact with at least a part of the substrate; and performing plating treatment on the substrate by applying cathode voltage to the substrate through the electrical contacts and applying anode voltage to the anode.

According to one embodiment of the present disclosure, performing plating treatment on the substrate comprises: driving the plating solution to flow towards the substrate by using the plating drive device.

REFERENCE NUMERALS OF THE ACCOMPANYING DRAWINGS

Figure 1:
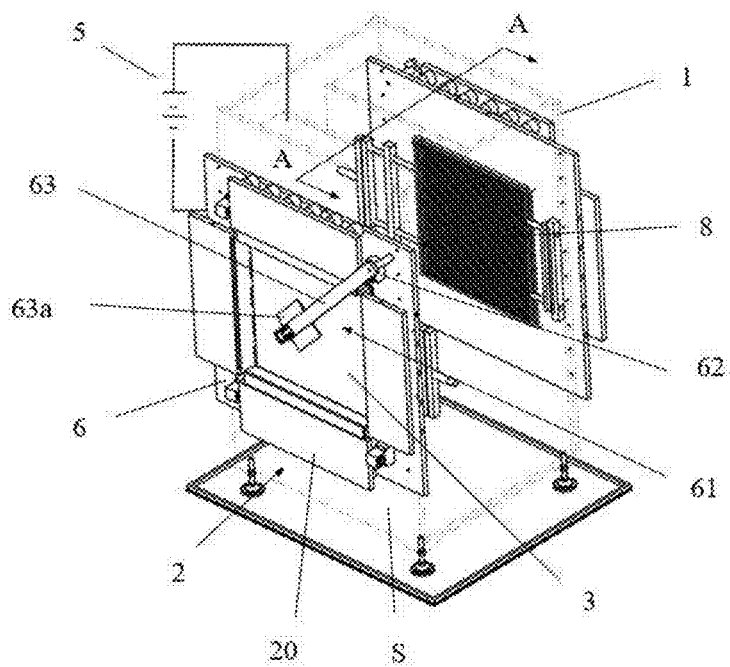
FIG. 1 is an overall schematic diagram of a plating apparatus provided by one embodiment of the present disclosure, in which the plating apparatus is in the operating state, and a substrate is mounted on an opening of a side wall of a tank body through a fixing device.

Inner side surface 213; Outer side surface 214; Front Surface 215; Rear Surface 216; Inner End Portion 217; Outer End Portion 218; Clamping Plate 22; Cantilever Element 23; Protrusion 23p; Clamping End 24; Angle α; Angle β; First Driving Mechanism 71; Second Driving Mechanism 72; Support Member 26; Connecting Plate 27; Cam Slot 27c; Guide Rail 28; Pivotal shaft 29; Pivotal axis P; Supporting Point P1; Longitudinal Axis of Cylinder Q; Extension Axis of Clamping End R; Substrate 3; First Substrate 3a; Second Substrate 3b; Anode 4; Power Supply Device 5; Substrate Mounting Plate 6; Hole 65; Substrate Mounting Area 6A; Sides of Hole 65a, 65b, 65c, 65d; Electrical Contact 66; Substrate stopper 61; Supporting Stand 62; Arm 63; Stop Portion 63a; Seal Ring 64; Plating solution Drive Device 8; Connecting Frame 81; Blade 82; Slide Bar 83; Duct 84; Holder 85.

DETAILED DESCRIPTION

The accompanying drawings are referred to in the following description of the exemplary embodiments of the present disclosure. The accompanying drawings form one part of the present disclosure. Various exemplary devices, systems and environments in which various aspects of the present disclosure may be practiced are shown by way of illustration.

In the description of the disclosure, the orientation or positional relationship indicated by "horizontal", "vertical", "upper", "lower", "top", "bottom", "left", "right", "front", "rear" and the like is based on the orientation or positional relationship as illustrated in the accompanying drawings, or the orientation or positional relationship that is conventionally placed when the device set in the present disclosure is used, or the orientation or positional relationship that is conventionally understood by those skilled in the art, is merely for ease of description of the present disclosure and simplified description, which does not indicate or imply that the device or component referred to must have a particular orientation and is constructed and operated in a particular orientation, and thus is not to be construed as a limitation to the present disclosure.

In some plating techniques, a substrate to be plated is placed horizontally in a plating tank with a surface to be plated facing downward, and a plating solution is spurted from below towards the surface to be plated. This method is generally called spurting method, and has obvious defect that bubbles may be easily accumulated on the surface to be plated in the plating process and are difficult to be removed and may adversely affect the plating quality.

In other plating techniques, the plating solution is injected from a lower part of the plating tank and filled into a tank body, and the substrate to be plated is placed vertically in the plating tank and immersed into the plating solution. This method may be referred to as dipping method. In this case, although the bubbles may be easily removed to form a plating surface with high quality, overcoming the disadvantages of the spray method to some extent, however, it is necessary to provide a holding device for the substrate in order to vertically fix the substrate to be plated in the plating tank. Such a holding device is generally complicated in structure, inconvenient to be operated, and difficult to firmly fix the substrate.

Figure 2:
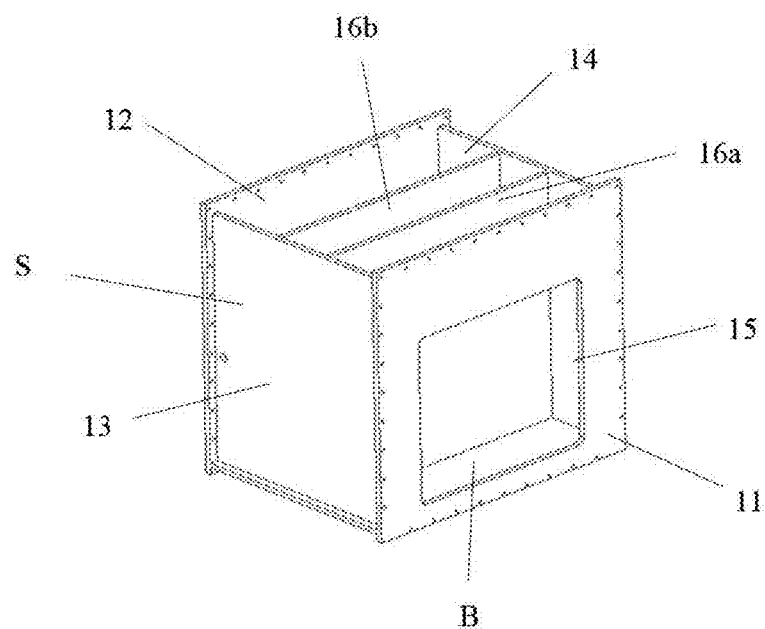
FIG. 2 is a perspective view of a tank body in one embodiment of the present disclosure.

FIG. 1 is a schematic diagram of a plating apparatus provided by one embodiment of the present disclosure. FIG. 2 is a schematic diagram of a tank body 1 of the plating apparatus provided by the present disclosure. As illustrated in FIGS. 1 and 2, the plating apparatus comprises a tank body 1 (as illustrated in FIG. 1 by dotted lines) and a fixing device 2. The tank body 1 is, for instance, made from an insulating material and comprises a bottom wall B (FIG. 2) and a plurality of side walls S. An opening 15 for communicating the inside and the outside of the tank body 1 (e.g., extending from the inside to the outside of the tank body) is formed on at least one of the plurality of side walls S. The fixing device 2 is disposed on the outside of the tank body 1 and configured to fix a substrate 3 on an outer side of the side wall S and at the position of the opening 15. Thus, the opening 15 allows a surface to be plated of the substrate 3 to face the inside of the tank body 1 and to be in contact with a plating solution accommodated in the tank body 1.

The plating tank in the present disclosure can have the following advantages:

1. As the substrate is fixed on the opening of the side wall along the vertical direction, bubbles generated in the plating process can rise to an upper surface of the plating solution due to buoyancy, and no bubble will be accumulated on the surface to be plated, thereby avoiding adversely affecting the quality of the coating.

2. As the substrate is directly mounted on the outer side of the side wall of the tank body, compared with the case that the substrate is vertically fixed inside the plating tank, a substrate holding device with complex structure can be omitted, thereby simplifying the structure of the plating apparatus. In addition, the assembly and disassembly operations of the substrate can also be carried out in a simpler and faster way from the outside of the tank body.

3. Since the structure of the plating apparatus and the mounting operation of the substrate are greatly simplified, the plating tank in the present disclosure is particularly suitable for processing a large substrate, e.g., a substrate with a size of 600 mm, and thus is particularly suitable for large-sized panel level semiconductor package.

As illustrated in FIG. 2, the plurality of side walls S of the tank body 1 comprise a front wall 11, a rear wall 12, a left wall 13 and a right wall 14. The bottom wall B and the plurality of side walls S define an accommodating space suitable for accommodating the plating solution together. The plating apparatus can further comprise a plating solution pumping device (not illustrated). FIG. 2 only illustrates an example of a tank body provided with four side walls. However, the embodiment of the present disclosure is not limited thereto. For instance, the tank body can comprise less than four side walls or more than four side walls. For instance, side wall parts positioned in the same plane are referred to as one side wall, and side wall parts positioned in different planes are referred to as different side walls.

According to one embodiment of the present disclosure, at least one of the side walls S of the tank body 1 is provided with an opening 15 for communicating the inside and the outside of the tank body 1 (e.g., extending from the inside to the outside of the tank body). The opening 15 can have a shape basically consistent with that of an area to be processed of the substrate 3, for instance, a roughly rectangular shape.

In some examples, at least two of the side walls S of the tank body 1 are provided with the opening 15 for communicating the inside and the outside of the tank body 1. In one embodiment of the present disclosure, the opening 15 for communicating the inside and the outside of the tank body 1 is formed on two opposite side walls S of the tank body 1, for instance, on the front wall 11 and the rear wall 12 as illustrated in FIGS. 1 and 2. In FIG. 2, the opening on the rear wall 12 is invisible.

The inside of the tank body 1 can further comprise partition walls. The partition walls and the side walls S of the tank body 1 define a plurality of separate plating tank parts in the tank body 1. Each plating tank part can correspond to one of the at least two side walls S provided with the openings 15. In the embodiment as illustrated in FIG. 2, a first partition wall 16a and a second partition wall 16b extend between the left wall 13 and the right wall 14 in a direction parallel to the front wall 11 and the rear wall 12 provided with the openings 15, so as to define two separate plating tank parts in the tank body 1. A first plating tank part is defined by the front wall 11, the left wall 13, the right wall 14, the first partition wall 16a and the bottom wall B, and a second plating part is defined by the rear wall 12, the left wall 13, the right wall 14, the second partition wall 16b and the bottom wall B.

Figure 3:
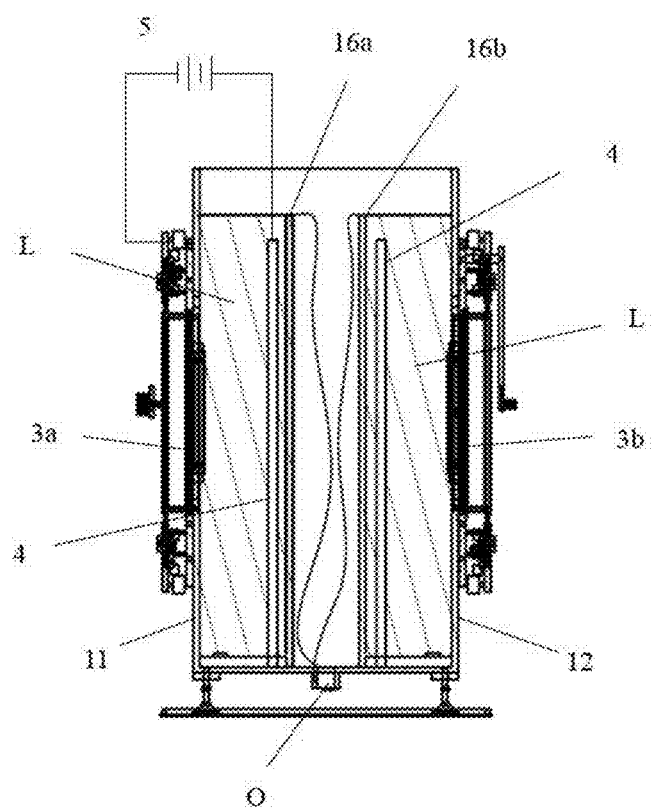
FIG. 3 is a sectional view of the plating apparatus as illustrated in FIG. 1 along the A-A line.

FIG. 3 is a sectional view of the plating apparatus as illustrated in FIG. 1 along the A-A line. As illustrated in FIG. 3, a first substrate 3a is fixed at the front wall 11 and in contact with the plating solution L accommodated in the first plating tank part. A second substrate 3b is fixed at the rear wall 12 and in contact with the plating solution L accommodated in the second plating tank part. The first plating tank part and the second plating tank part can be respectively provided with a plating solution inlet (not illustrated in the figure) on the bottom wall B of the inside thereof. A plating solution outlet O can be disposed on the bottom wall B of the tank body 1 between the first partition wall 16a and the second partition wall 16b. That is to say, the plating solution outlet O is disposed outside the first plating tank part and the second plating tank part. The height of the first partition wall 16a and the second partition wall 16b can be less than that of the front wall 11 and the rear wall 12. In the plating process, the plating solution L is injected into the first plating tank part and the second plating tank part from the plating solution inlets in the first plating tank part and the second plating tank part and gradually filled into the first plating tank part and the second plating tank part. When the liquid level of the plating solution L arrives at the level of the first partition wall 16a and the second partition wall 16b, the plating solution L overflows from the first plating tank part and the second plating tank part (as illustrated by streamlines of the plating solution L schematically drawn in FIG. 3) and is discharged from the tank body 1 through the plating solution outlet O. Thus, the first plating tank part and the second plating tank part in the tank body 1 can be separated from each other and perform plating treatment on the first substrate 3a fixed on the front wall 11 and the second substrate 3b fixed on the rear wall 12 at the same time in a way that does not affect each other. Therefore, the processing efficiency of the plating apparatus can be greatly improved.

In some examples, the opening is disposed on more than two side walls of the tank body, and one or more openings can be disposed on each of the side walls. Discrete plating tank parts can be divided inside the tank body according to the number of the openings to simultaneously perform plating treatment on more substrates to be plated, thereby improving the efficiency of plating treatment by several times.

As illustrated in FIG. 3, the plating apparatus further comprises an anode 4 which can be disposed in the plating tank and faces the side walls 11 and 12 provided with the openings. The anode 4 is, for instance, a plate member formed by plated metal. The plating apparatus can further comprise a power supply device 5. The power supply device 5 has an anode connected to the anode 4, and a cathode connected to the substrate to be plated 3. In the plating process, the power supply device 5 can apply voltage between the substrate to be plated 3 and the anode 4. Thus, electrons with negative charges will accumulate on the surface to be plated of the substrate 3 to be plated, while the plated metal of the anode 4 will precipitate metal ions with positive charges. The metal ions with positive charges are attracted by the negative charges carried by the electrons accumulated on the surface to be plated and flow to the surface to be plated, and combine with the electrons to form metal atoms, which are then deposited on the surface to be plated to form a plated metal layer.

As illustrated in FIG. 1, in some examples, the plating apparatus further comprises a substrate mounting plate 6. The substrate 3 is mounted on the substrate mounting plate 6 and fixed on the outer side of the side wall S of the tank body 1. For instance, the substrate mounting plate 6 is disposed between the fixing device 2 and the side wall S. An exemplary structure of the substrate mounting plate 6 will be described below with reference to FIGS. 4 and 5.

Figure 4:
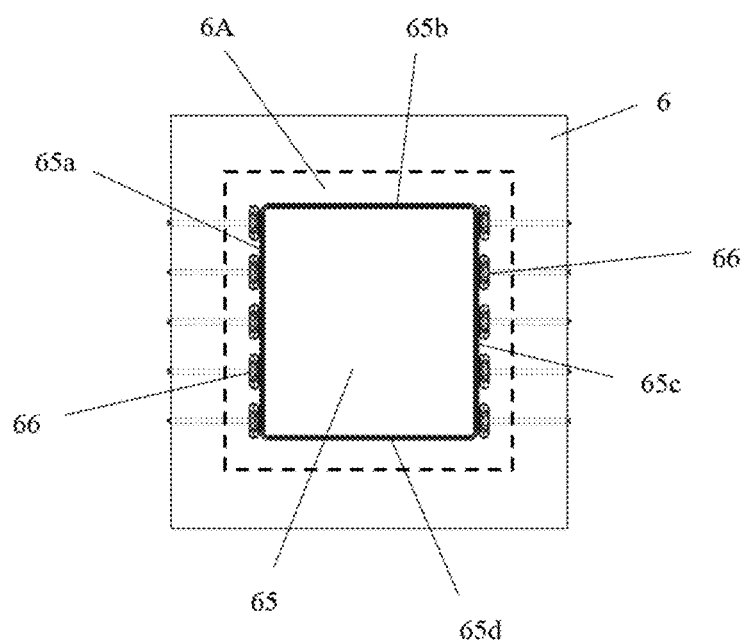
FIG. 4 is a schematic diagram of a substrate mounting plate in one embodiment of the present disclosure.
Figure 5:
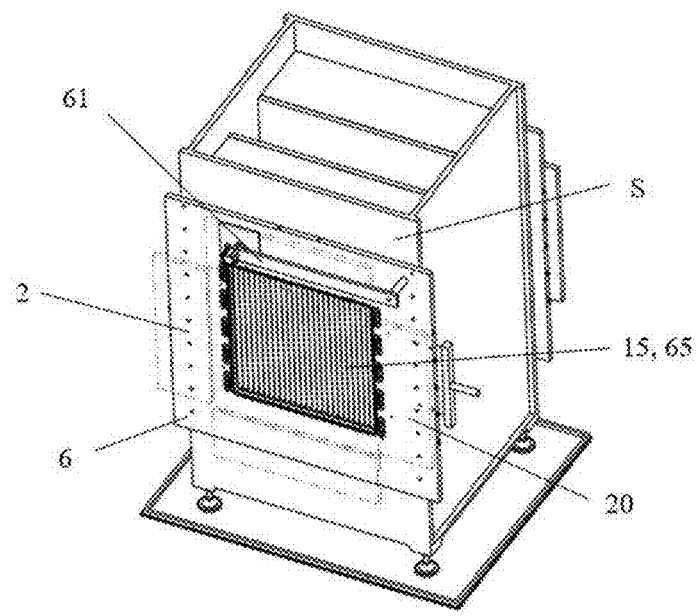
FIG. 5 is an overall schematic diagram of a plating apparatus in one embodiment of the present disclosure, in which the plating apparatus is in the non-operating state.

As illustrated in FIG. 4, the substrate mounting plate 6 is provided with a hole 65. The hole 65 can have a shape substantially consistent with that of the opening 15 of the side wall S or a region to be processed of the substrate 3. In the embodiment as illustrated in FIG. 4, the hole 56 of the substrate mounting plate 6 is of a roughly rectangular shape. The substrate mounting plate 6 is fixed on the outer side of the side wall S provided with the opening 15, so that the position of the hole 65 of the substrate mounting plate 6 can correspond to the position of the opening 15 of the side wall S (as illustrated in FIG. 5). For instance, the shape and the size of the hole 65 of the substrate mounting plate 6 are respectively the same as the shape and the size of the opening 15 of the side wall S, or the shape of the hole 65 of the substrate mounting plate 6 is the same as the shape of the opening 15 of the side wall S but the size of the hole is slightly larger or slightly smaller than the size of the opening of the side wall S, but the embodiment of the present disclosure is not limited thereto. For instance, the phrasing that the position of the hole 65 of the substrate mounting plate 6 "corresponds to" the position of the opening 15 of the side wall S refers to that the areas of the hole 65 and the opening 15 are at least partially overlapped. In some examples, "corresponds to" refers to that the hole 65 and the opening 15 are in a state that the hole 65 and the opening 15 have a maximum overlapping area. In the plating process, the surface to be plated of the substrate 3 can be exposed in the plating solution in the tank body 1 through the hole 65 in the substrate mounting plate 6 and the opening 15 in the side wall S.

In some examples, the fixation between the substrate mounting plate 6 and the side wall S can be a detachable connection through one or more fasteners (for example, screws or bolts). In some examples, the fixation between the substrate mounting plate 6 and the side wall S can be almost permanent connection (e.g., welded joint or adhesive).

The substrate mounting plate 6 is provided with a substrate mounting area 6A (as illustrated by a dotted box part in FIG. 4). The substrate mounting area 6A is arranged around the hole 65 and configured to extend along each side of the hole 65. For instance, when the substrate 3 is mounted on the substrate mounting plate 6, the edge of the substrate 3 laps over the substrate mounting area 6A.

One or more electrical contacts 66 are disposed in the substrate mounting area 6A of the substrate mounting plate 6 and configured to be electrically connected with the substrate to be plated 3. The electrical contacts 66 are electrically connected to the cathode of the power supply device 5 (FIG. 3). Thus, when the substrate to be plated 3 is mounted on the substrate mounting plate 6, the electrical connection between the substrate to be plated 3 and the cathode is provided.

The electrical contacts 66 can be arranged along one or more sides of the hole 65 of the substrate mounting plate 6. In the embodiment as illustrated in FIG. 4, a plurality of electrical contacts 66 are equidistantly distributed on two opposite sides of the hole 65 of the substrate mounting plate 6. In other embodiments, the plurality of electrical contacts 66 can also be equidistantly distributed on four sides of the hole 65 of the substrate mounting plate 6. In one embodiment, four or more electrical contacts 66 are distributed on each side.

In some examples, the plating apparatus can further comprise a resistance measuring device (not illustrated) electrically connected to the above electrical contact 66. After the substrate 3 is mounted on the substrate mounting plate 6 by means of the fixing device 2, the resistance measuring device can be used to measure the contact resistance between the substrate 3 and the electrical contacts 66, so as to determine whether the connection status between the substrate 3 and the electrical contacts 66 is in good condition. For instance, the resistance measuring device is electrically connected to four electrical contacts 66 disposed on one side. Thus, the resistance measuring device can measure the contact resistance between the substrate 3 and the electrical contacts 66 by utilization of the four-point method.

According to one embodiment of the present disclosure, as illustrated in FIG. 1, the fixing device 2 is fixed on the substrate mounting plate 6 and configured to mount the substrate to be plated 3 on the substrate mounting area of the substrate mounting plate 6, for instance, by applying pressure to the substrate 3 in the substrate mounting area in the direction towards the side wall 3.

In other embodiments, the fixing device 2 can also be set in a way different from that of the embodiment as illustrated in FIG. 1. Optionally, the fixing device 2 can be directly disposed on the side wall S of the tank body 1. Optionally, the fixing device 2 can be a pressure applying device completely independent of the tank body 1 and the substrate mounting plate 6.

According to one embodiment of the present disclosure, the fixing device 2 comprise at least one clamping piece. In some examples, the fixing device 2 can comprise a plurality of clamping pieces. As illustrated in FIGS. 1 and 5, four clamping pieces 20 are disposed on the periphery of the hole 65 of the substrate mounting plate 6 and are respectively distributed at positions close to four sides of the hole 65 of the substrate mounting plate 6. Each clamping piece 20 is configured to apply a pressure to the substrate 3 on a side of the hole 65 along the direction towards the side wall S. Thus, the fixing device can be constructed in a convenient and lightweight manner, and the substrate 3 is fixed on the substrate mounting plate 6 in a fluid seal manner.

An exemplary structure of the clamping piece 20 in one embodiment of the present disclosure will be described below with reference to FIGS. 6 to 10. In the following description, the xyz coordinate system is defined with reference to the substrate mounting plate 6. The z axis is perpendicular to the substrate mounting plate 6, and a positive direction thereof is the direction away from the substrate mounting plate 6. The x axis is perpendicular to the side of the hole 65 of the substrate mounting plate 6, and a positive direction thereof is directed from one side of the substrate mounting area 6A away from the hole 65 to the substrate mounting area 6A, namely directing from the substrate mounting area 6A to the center of the hole 65.

Figure 6:
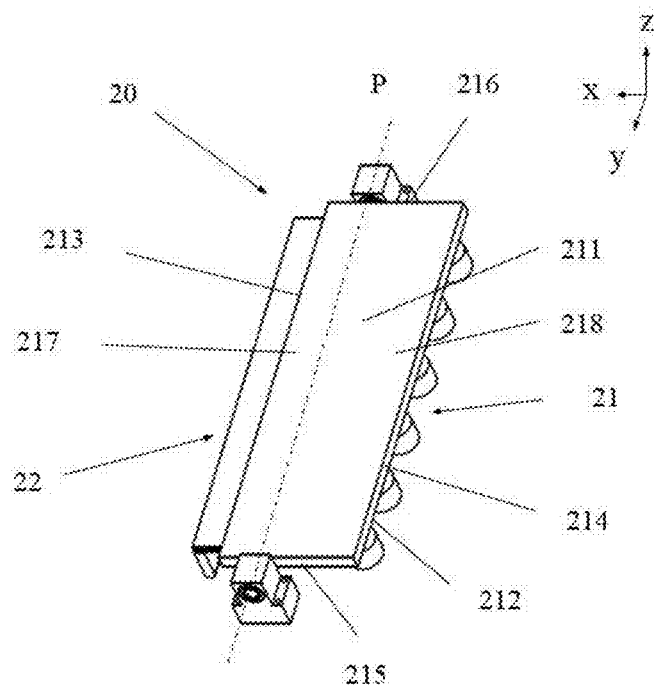
FIG. 6 is a top view perspective diagram of a fixing device in one embodiment of the present disclosure, in which one clamping piece is illustrated.

According to one embodiment of the present disclosure, as illustrated in FIG. 6, the clamping piece 20 can comprise a supporting plate 21 and a clamping plate 22.

The supporting plate 21 is a plate member extending along the length direction, the width direction and the thickness direction. The length direction is parallel to the side of the hole 65 of the substrate mounting plate 6 close to the supporting plate 21. The width direction is perpendicular to the side of the hole 65 of the substrate mounting plate 6 close to the supporting plate 21.

Figure 7:
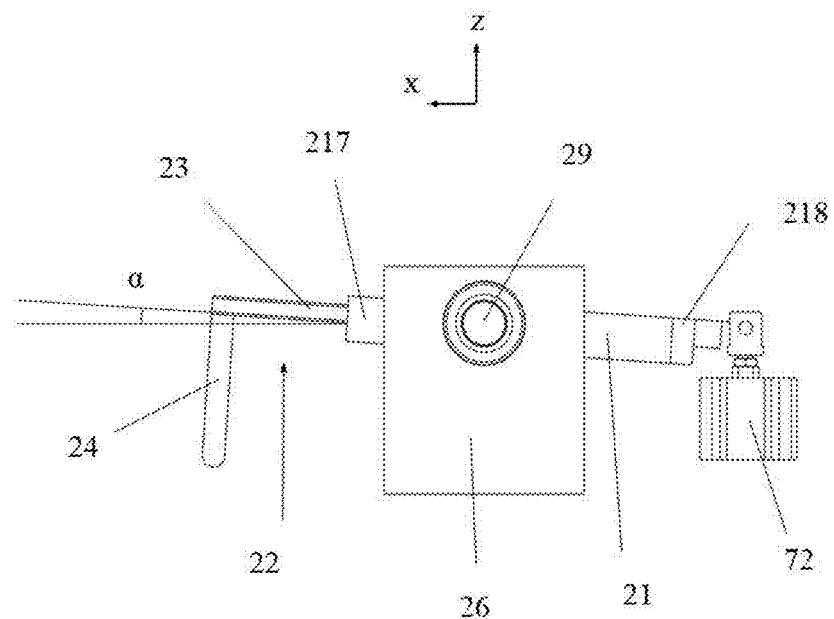
FIG. 7 is a front view schematic diagram of the fixing device in one embodiment of the present disclosure, in which one clamping piece is illustrated.

As illustrated in FIG. 7, the clamping plate 22 is a plate member has an L-like sectional shape and comprises a cantilever element 23 and a clamping end 24 which form two branches of the L-like shape. The clamping end 24 extends from one end of the cantilever element 23 along a direction roughly perpendicular to the extension direction of the cantilever element 23. The clamping end 24 is configured to contact the substrate 3 and apply a pressure to the substrate 3 in the direction towards the substrate mounting plate 6.

For the convenience of description, the geometric characteristics of the supporting plate 21 are defined as follows.

As illustrated in FIG. 6, the supporting plate 21 comprises an upper surface 211 and a lower surface 212, which are opposite to each other and extend in the length direction and the width direction. The lower surface 212 is a surface facing the substrate mounting plate 6, and the upper surface 211 is a surface facing away from the substrate mounting plate 6. The supporting plate 21 comprises an inner side surface 213 and an outer side surface 214, which are opposite to each other and extend in the length direction and the thickness direction. The inner side surface 213 faces the hole 65 of the substrate mounting plate 6, and the outer side surface faces away from the hole 65 of the substrate mounting plate 6. The supporting plate 21 further comprises a front surface 215 and a rear surface 216, which are opposite to each other and extend in the width direction and the thickness direction. The front surface 215 is a surface near the bottom of the image in FIG. 6. The supporting plate 21 comprises two opposite end portions along the width direction which are respectively an inner end portion 217 and an outer end portion 218. The inner end portion 217 terminates at the inner side surface 213, and the outer end portion 218 terminates at the outer side surface 214.

Figure 8:
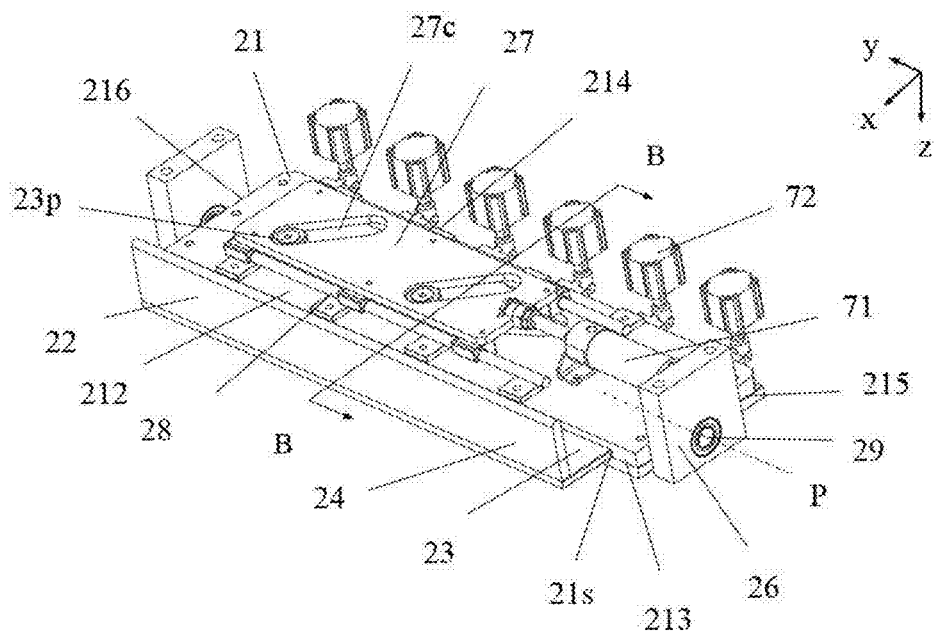
FIG. 8 is a bottom view perspective diagram of the fixing device in one embodiment of the present disclosure, in which one clamping piece is illustrated.
Figure 9:
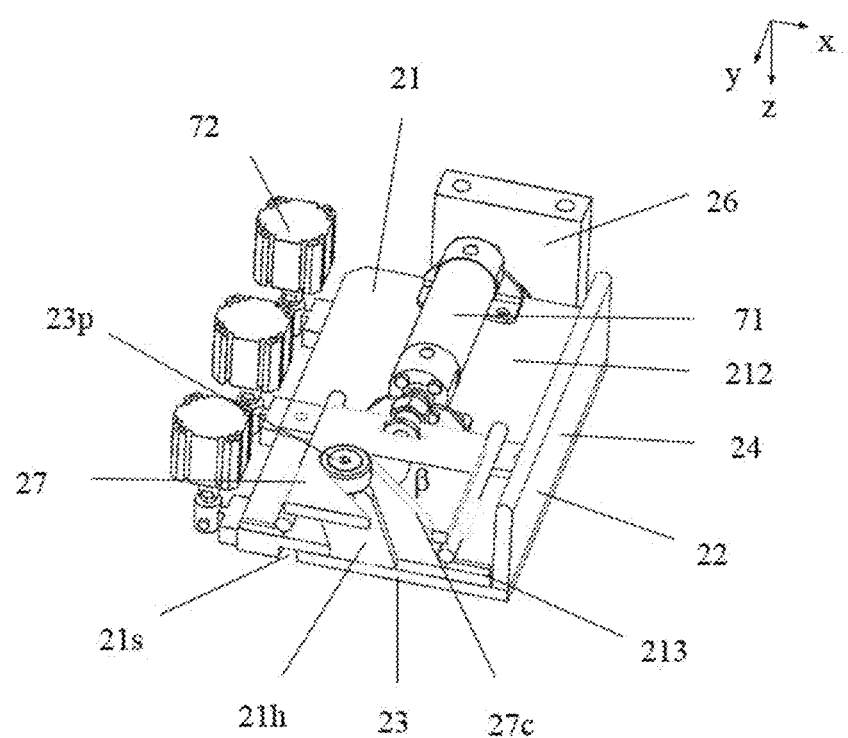
FIG. 9 is a sectional view of the fixing device as illustrated in FIG. 8 along the B-B line.

The supporting plate 21 comprises a receiving slot 21s (as illustrated in FIGS. 8 and 9) which is open on the inner side surface 213. The cantilever element 23 of the clamping plate 22 is inserted into the receiving slot 21s through the opening on the inner side surface 213 of the supporting plate 21. The cantilever element 23 is configured to slide in the receiving slot 21s along the x-axis direction, so that the clamping plate 22 moves between an extension position (referring to FIG. 8) and a retraction position (referring to FIG. 9). The extension position is closer to the center of the hole 65 of the substrate mounting plate 6 along the x-axis direction compared with the retraction position. At the extension position, a part (for instance, the clamping end 24) of the clamping plate 22 can be positioned above the substrate mounting area 6A. At the retraction position, the clamping plate 22 is not positioned above the substrate mounting area 6A. The phrasing of "positioned above the substrate mounting area 6A" indicates that an orthographic projection on the substrate mounting plate 6 is overlapped with the substrate mounting area 6A. Therefore, at the retraction position of the clamping plate 22, the substrate 3 can pass through the space above the substrate mounting area 6A without hindrance, thereby allowing convenient operation of placing the substrate 3 on the substrate mounting plate 6 or removing the substrate 3 from the substrate mounting plate 6.

Figure 10:
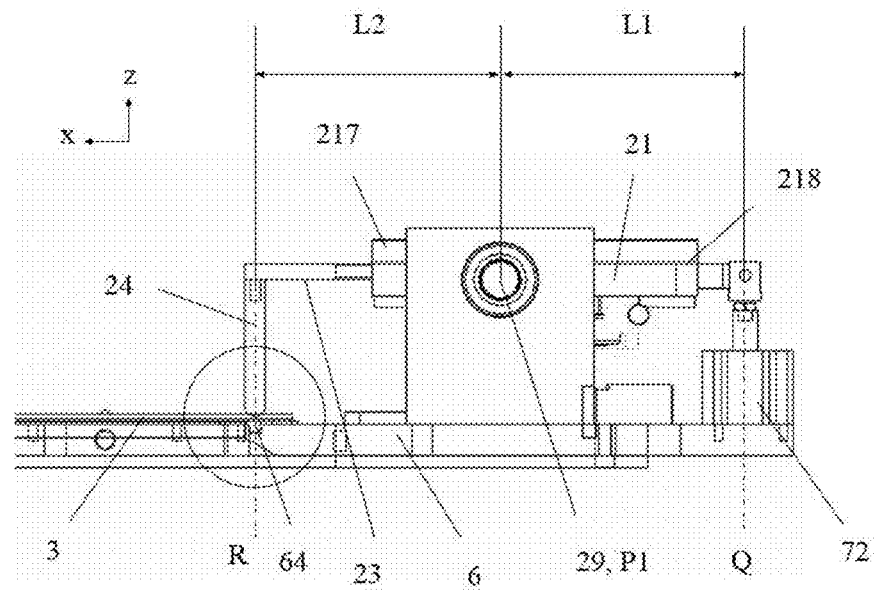
FIG. 10 is a front view schematic diagram of the fixing device in one embodiment of the present disclosure, in which a substrate mounting plate and a substrate are illustrated.

As illustrated in FIG. 6, the supporting plate 21 is configured to rotate about a pivotal axis P parallel to the y axis, so that the supporting plate 21 can move between an inclination position (as illustrated in FIG. 7) and a parallel position (as illustrated in FIG. 10), and then the clamping end 24 of the clamping plate 22 can move away from or close to the substrate mounting area 6A in the z-axis direction. As illustrated in FIG. 7, at the inclination position, the supporting plate 21 is inclined relative to the substrate mounting plate 6, namely an angle α of greater than 0° and less than 90e is formed between the upper surface 211 (or the lower surface 212) of the supporting plate 21 and the plane of the substrate mounting plate 6, so that the inner end portion 217 of the supporting plate 21 can be farther away from the substrate mounting plate 6 compared with the outer end portion 218. At the inclination position, the clamping end 24 of the clamping plate 22 does not contact the substrate 3 disposed on the substrate mounting plate 6. As illustrated in FIG. 10, at the parallel position, the supporting plate 21 is roughly parallel to the substrate mounting plate 6, and the clamping end 24 of the clamping plate 22 presses against the substrate 3 disposed on the substrate mounting plate 6.

The operation process of the fixing device 2 is as follows: in the case that the plating apparatus does not operate, the supporting plate 21 is at the inclination position and the clamping plate 22 is at the retraction position. The operator can place the substrate to be plated 3 on the substrate mounting area 6A of the substrate mounting plate 6. After the substrate is placed, the operator can move the clamping plate 22 disposed in the receiving slot 21s of the supporting plate 21 from the retraction position to the extension position, so that the clamping end 24 of the clamping plate 22 can move to the position above the substrate mounting area 6A. The operator can then move the supporting plate 21 from the inclination position to the parallel position, so that the clamping end 24 of the clamping plate 22 can move towards the substrate mounting area 6A and apply a pressure to the substrate 3, and the substrate 3 is therefore fastened on the substrate mounting plate 6 in the substrate mounting area 6A.

In a variant example not illustrated of the present disclosure, the clamping piece 20 can be a plate member in which a pressing portion is fixed at one end, and can move in the x-axis direction and the z-axis direction integrally under the guidance of, for example, a guide rail. In the process of mounting the substrate 3, the clamping piece 20 can move along a guide rail extending along the x-axis direction towards the center of the hole 65 at first, so that the pressing portion can be disposed above the substrate mounting area 6A. Different from the pivotal motion around the y axis of the supporting plate 21 in the above embodiment, in this embodiment, the clamping piece 20 can integrally perform a linear movement towards the substrate mounting plate 6 along a guide rail 28 (refer to FIG. 8) extending along the z-axis direction, so that the pressing portion can apply a pressure to the substrate 3 on the substrate mounting area 6A.

As for the design of the clamping piece 20, the principle followed by the present disclosure is that at least one part of the clamping piece 20 can move in the x-axis direction and the z-axis direction. Firstly, at least one part of the clamping piece 20 can move in the x-axis direction between one side of the substrate mounting area 6A away from the hole 65 (corresponding to the above retracted position) and the substrate mounting area 6A (corresponding to the above extended position), so as to leave an operation space for the placement and removal of the substrate 3 above the substrate mounting area 6A. Secondly, at least one part (for instance, the clamping end 24) of the clamping piece 20 can move in the z-axis direction, so as to press against the substrate 3 disposed on the substrate mounting plate 6 and apply a pressure to the substrate, or release the pressure and leave from the substrate 3. Under the guidance of this principle, other structural designs and movement modes of the clamping piece 20 can be envisioned by those skilled in the art without departing from the scope of protection of the present disclosure.

According to one embodiment of the present disclosure, the fixing device 2 further comprises driving mechanisms which are configured to drive the motion of the clamping piece 20.

In some examples, the fixing device 2 comprises a first driving mechanism 71 and a second driving mechanism 72. The first driving mechanism 71 is configured to drive at least one part of the clamping piece 20 along the x-axis direction, so that the at least one part of the clamping piece 20 can move from one side of the substrate mounting area 6A away from the hole 65 to the substrate mounting area 6A. The second driving mechanism 72 is configured to drive at least one part of the clamping piece 20 along the z-axis direction, so that the at least one part of the clamping piece 20 can apply a pressure towards the substrate mounting area 6A.

It should be noted that "the first driving mechanism 71 drives at least one part of the clamping piece 20 along the x-axis direction" is not limited to the case where the movement trajectory of the at least one part of the clamping piece 20 is along the x-axis direction. The at least one part of the clamping piece 20 can also move along a direction that is at an angle to the x-axis direction driven by the first driving mechanism 71. For instance, in a state where the clamping piece 20 is at, for example, the inclination position as illustrated in FIG. 7, the movement direction of the at least one part of the clamping piece 20 forms a certain angle with the x-axis direction. "The first driving mechanism 71 drives the at least one part of the clamping piece 20 along the x-axis direction" should be understood as that the motion of the at least one part of the clamping piece 20 contains a motion component along the x-axis direction.

The driving mechanism can be any of a variety of linear drive units known to those skilled in the art, e.g., an electric motor, a cylinder or a ball screw. The first driving mechanisms 71 and the second driving mechanism 72 of the plurality of clamping pieces 20 can be connected to a control module, and the control module can simultaneously operate the plurality of clamping pieces 20 in response to an instruction of the operator. This automated implementation significantly reduces the fixed operation time and reduces the production cost. In addition, the fixing operation by the driving mechanisms is highly reproducible and uniform compared to manual operation, thereby ensuring the reliability of the fixing operation and the sealing effect of substrate mounting.

FIGS. 8-10 illustrate in detail the first driving mechanism 71 and the second driving mechanism 72 in one embodiment of the present disclosure. As an example, both the first driving mechanism 71 and the second driving mechanism 72 are in the form of a cylinder, and the cylinder can comprise a cylinder barrel and a piston rod capable of performing linear reciprocating motion in the cylinder barrel.

FIG. 8 is a bottom view perspective diagram of the fixing device 2 in the present disclosure (observed from the lower surface 212 of the supporting plate 21). FIG. 9 is another bottom view perspective diagram of the fixing device 2 in the present disclosure illustrated in a sectional form (observed from the lower surface 212 of the supporting plate 21).

The fixing device 2 can comprise two support members 26 respectively disposed at the front surface 215 and the rear surface 216 of the supporting plate 21. The first driving mechanism 71 is configured such that the cylinder barrel thereof is fixed at one of the support members 26 and the longitudinal axis of the cylinder barrel extends along the y-axis direction, so that the piston rod of the first driving mechanism 71 can perform linear reciprocating motion along the y-axis direction.

Apart from the supporting plate 21 and the clamping plate 22, the clamping piece 20 further comprises a connecting plate 27 which is disposed on the lower surface 212 of the supporting plate 21 and fixedly connected to an end portion of the piston rod of the first driving mechanism 71. The guide rail 28 extending along the y-axis direction can also be disposed on the lower surface 212 of the supporting plate 21.

Thus, the linear motion along the y-axis direction of the connecting plate 27 can be guided along the guide rail 28.

The connecting plate comprises at least one cam slot 27c. The cam slot 27c is of an elongated shape, for instance, an oblong shape, and an extension axis thereof is between the x axis and the y axis and forms an angle of larger than 0° and smaller than 90° with the x axis (FIG. 9). In the embodiment as illustrated in FIG. 8, two cam slots 27c are provided.

As illustrated in FIGS. 8 and 9, the cantilever element 23 of the clamping plate 2 can be provided with a cylindrical protrusion 23p. The protrusion 23p passes through the supporting plate 21 and engages with the cam slot 27c of the connecting plate 27. Thus, the supporting plate 21 can be provided with a through hole 21h for the protrusion 23p to move freely therein (FIG. 9), and the through hole 21h communicates the receiving slot 21s of the supporting plate 21 and the lower surface 212 of the supporting plate 21 (e.g., extends from the receiving slot 21s of the supporting plate 21 to the lower surface 212 of the supporting plate 21). In the embodiment as illustrated in FIG. 8, two protrusions 23p are provided.

In the case that the connecting plate 27 performs linear motion along the y axis driven by the first driving mechanism 71, the connecting plate 27 drives the protrusion 23p to move in the cam slot 27c along the extension axis of the cam slot 27c, so that the clamping plate 22 can slide in the receiving slot 21s of the supporting plate 21 along the x-axis direction and thus move between the extension position and the retraction position.

FIG. 8 illustrates the clamping plate 22 disposed at the extension position, and FIG. 9 illustrates the clamping plate 22 disposed at the retracted position. Starting from the position as illustrated in FIG. 8, when the first driving mechanism 71 drives the connecting plate 27 to move towards the positive direction of the y axis, the protrusion 23p moves along the extension axis of the cam slot 27c from a position in the cam slot 27c closest to the center of the hole 65 to a position in the cam slot 27c farthest from the center of the hole 65, so that the clamping plate 22 can move to the retraction position as illustrated in FIG. 9. Reversely, starting from the position as illustrated in FIG. 9, when the first driving mechanism 71 drives the connecting plate 27 to move towards the negative direction of they axis, the protrusion 23p moves along the extension axis of the cam slot 27c from the position in the cam slot 27c farthest from the center of the hole 65 to the position in the cam slot 27c closest to the center of the hole 65, so that the clamping plate 22 can move to the extension position as illustrated in FIG. 8.

As illustrated in FIG. 10, the second driving mechanism 72 is configured such that the cylinder barrel thereof is fixed on the substrate mounting plate 6 and the longitudinal axis of the cylinder barrel extends along the z axis direction, so that the piston rod of the second driving mechanism 72 can perform linear reciprocating motion along the z-axis direction. The outer end portion 218 of the supporting plate 21 is fixedly connected to the end portion of the piston rod of the second driving mechanism 72.

Returning to FIG. 8, the supporting plate 21 can comprise a pivotal shaft 29 protruding from the front surface 215 and the rear surface 216 thereof, so as to define a pivotal axis P. The support member 26 is provided with a mounting hole, and the pivotal shaft 29 of the supporting plate 21 can be inserted into the mounting hole of the support member 26. The mounting hole can also be provided with a bearing for supporting the rotating pivotal shaft 29 in the mounting hole. In some examples, the pivotal shaft is connected to the middle part of the supporting plate, and the middle part refers to the position between the inner end portion and the outer end portion of the supporting plate. In some examples, the pivotal shaft 29 is disposed at a roughly middle position of the supporting plate 21 in the width direction.

In the case that the outer end portion 218 of the supporting plate 21 performs linear motion along the z axis driven by the second driving mechanism 72, the supporting plate 21 can rotate about the pivotal shaft 29, so that the supporting plate 21 can move between the parallel position and the inclination position.

In the embodiment as illustrated in FIG. 10, in a state where the supporting plate 21 is at the parallel position, as measured along the x-axis direction, the first distance L1 between the pivotal shaft 29 and the second driving mechanism 72 is greater than the second distance L2 between the pivotal shaft 29 and the clamping end 24 of the clamping plate 22. As observed in the xz plane, the pivotal axis P of the pivotal shaft 29 and the xz plane intersect at a supporting point P1, and the supporting point P1 is point of support of the lever motion of the clamping piece. The first distance L1 between the pivotal shaft 29 and the second driving mechanism 72 refers to the distance between the supporting point P1 and a longitudinal axis Q of the cylinder barrel of the second driving mechanism 72 along the x-axis direction. The second distance L2 between the pivotal shaft 29 and the clamping end 24 of the clamping plate 22 refers to the distance between the supporting point P1 and an extension axis R of the clamping end 24 of the clamping plate 22 along the x-axis direction.

Thus, the force applied by the second driving mechanism 72 can be amplified through the lever principle, so that the fixing of the substrate 3 at the clamping end 24 of the clamping plate 22 can be more stable, thereby enhancing the sealing effect and preventing the leakage of the plating solution during the plating process.

In some examples, the first distance L1 is twice the second distance L2.

FIG. 7 illustrates the fixing device 2 of which the supporting plate 21 is at the inclination position and the clamping plate 22 is at the extension position. FIG. 10 illustrates the fixing device 2 of which the supporting plate 21 is at the parallel position and the clamping plate 22 is at the extension position. Starting from the position as illustrated in FIG. 7, when the second driving mechanism 72 drives the outer end portion 218 of the supporting plate 21 along the positive direction of the z axis, the supporting plate 21 can rotate about the pivotal shaft 29 until arriving at the parallel position as illustrated in FIG. 10. During this process, the inner end portion 217 of the supporting plate 21 and the clamping end 24 of the clamping plate 22 roughly moves along the negative direction of the z axis. At the parallel position as illustrated in FIG. 10, the second driving mechanism 72 drives the outer end portion 218 of the supporting plate 21 along the positive direction of the z axis, so that the clamping end 24 of the clamping plate 22 can apply a pressure to the substrate 3 in the substrate mounting area 6A along the negative direction of the z axis. Thus, the substrate 3 is firmly mounted on the substrate mounting plate 6.

In some examples, the pivotal shaft 29 of the supporting plate 21 can be arranged in a manner different from that of the above embodiment. For instance, the pivotal shaft 29 can be disposed on the outer end portion 218 of the supporting plate 21 in the width direction, and the end portion of the piston rod of the second driving mechanism 72 is connected to the middle part of the supporting plate 21 in the width direction.

According to one embodiment of the present disclosure, as illustrated in FIG. 8, the second driving mechanism 72 can comprise a plurality of cylinders which are equidistantly distributed in the length direction of the supporting plate 21. As a result, the driving force of the second driving mechanism 72 applied to the outer end portion of the supporting plate 21 can be uniformly distributed in the length direction of the supporting plate 21. Thus, the fixing force applied to the substrate 3 can be uniformly distributed along the side of the substrate mounting area 6A, thereby ensuring the sealing contact between the substrate 3 and the substrate mounting plate 6 at different positions.

As illustrated in FIGS. 1 and 5, the plating apparatus further comprises a substrate stopper 61 which is configured to move from the outer side of the opening 15 to the middle part of the opening 15.

According to one embodiment of the present disclosure, as illustrated in FIG. 1, the substrate stopper 61 comprises a supporting stand 62 connected to the substrate mounting plate 6 and an arm 63 roughly parallel to the substrate mounting plate 6. An articulating member can be disposed at one end of the arm 63 and engage with a receiving hole in the supporting stand 62, so as to define an articulating axis of the arm 63. The articulating axis is perpendicular to the substrate mounting plate 6. A stop portion 63a can be connected to one end of the arm 63 and is, for instance, formed into a thin piece parallel to the substrate mounting plate 6. Thus, the arm 63 can rotate about the articulating axis between an idle position at the outer side of the opening 15 and a stop position above the opening 15 in the plane parallel to the substrate mounting plate 6. In some examples, an adjusting device (not illustrated), for instance, an adjusting bolt, of the stop portion 63a can be disposed on the arm 63 at one end of the stop portion 63a and is configured to adjust the distance between the stop portion 63a and the substrate mounting plate 6. Thus, the stop portion 63a can be adjusted to a position away from the substrate mounting plate 6 in the rotation process of the arm 63, thereby avoiding the collision with other units, for instance, the fixing device 2, on the substrate mounting plate 6.

Before plating treatment, the substrate stopper 61 can be disposed at the idle position (as illustrated in FIG. 5). In this case, the stop portion 63a is positioned on the outer side of the opening 15 of the side wall S, so that the substrate 3 can be mounted and fixed on the substrate mounting plate 6. During plating treatment, the arm 63 can be rotated to the stop position (as illustrated in FIG. 1). In this case, the stop portion 63a is positioned in the middle part of the opening 15 of the side wall S and blocks at the outer side of the substrate 3 to prevent the deformation of the substrate 3 under the pressure of the plating solution L in the tank body 1.

Figure 11:
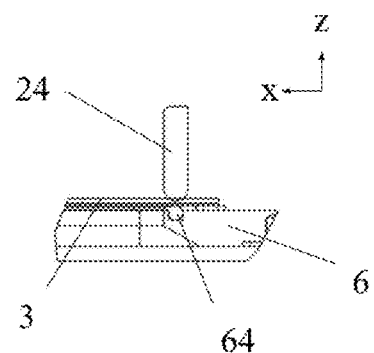
FIG. 11 is a partial enlarged view of a clamping end as illustrated in FIG. 10.
Figure 12:
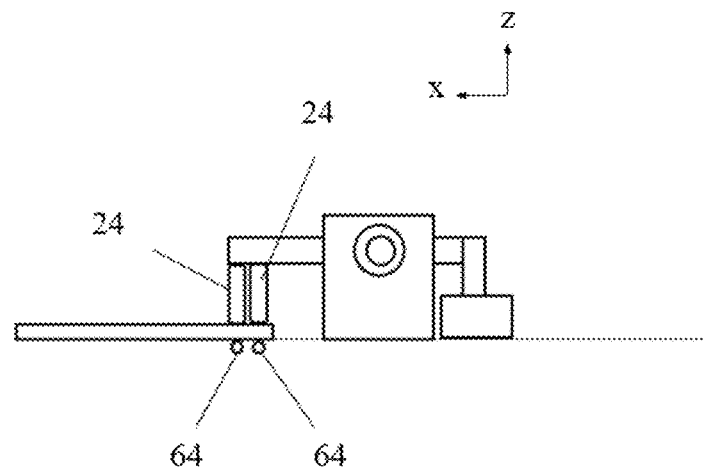
FIG. 12 is a front view schematic diagram of a fixing device in another embodiment of the present disclosure.

In some examples, as illustrated in FIGS. 10 to 12, the plating apparatus further comprises at least one sealing element. The sealing element can be disposed at an area of the substrate mounting plate 6 around the hole 65, so as to ensure a good sealing between the substrate 3 and the substrate mounting plate 6. The sealing element can further be disposed at an area of the side wall S around the opening 15, so as to ensure a good sealing between the side wall S and the substrate mounting plate 6.

In one embodiment of the present disclosure, as illustrated in FIG. 10, the sealing element is the form of a seal ring 64. The substrate mounting plate 6 can be provided with a recessed portion for accommodating the seal ring 64. In some examples, as illustrated in FIG. 10, the recessed portion is open towards the outer side of the substrate mounting plate, so as to ensure the good sealing between the substrate 3 and the substrate mounting plate 6. In some examples (not illustrated), the recessed portion is open towards the inner side of the substrate mounting plate, so as to ensure the good sealing between the side wall S and the substrate mounting plate 6. In some examples (not illustrated), a recessed portion for accommodating the seal ring 64 can be disposed on the outer side of the side wall S, so as to ensure the good sealing between the side wall S and the substrate mounting plate 6. In another embodiment of the present disclosure (not illustrated), the seal ring is in the form of a gasket; the gasket can be of a rectangular shape provided with a hollow part. The shape and the size of the hollow part are, for instance, substantially consistent with those of the hole 65 of the substrate mounting plate 6 or the opening 15 of the side wall S. The gasket is placed between the substrate 3 and the substrate mounting plate 6 and/or between the substrate mounting plate 6 and the side wall S.

As illustrated in the partial schematic diagram FIG. 11, the position of the sealing element is set such that: when the supporting plate 21 is at the parallel position, the position of the clamping end 24 of the clamping plate 22 at which the pressure is applied to the substrate mounting plate 6 at least partially overlaps with the position of the sealing element along the z axis. Thus, the sealing effect of the sealing element can be improved due to the pressure applied to the sealing element, thereby preventing the leakage of the plating solution L in the plating process.

In order to further improve the sealing effect, as illustrated in FIG. 12, the clamping plate 22 of the clamping piece 20 of the fixing device 2 can comprise a plurality of clamping ends 24. Correspondingly, the sealing elements can be distributed at positions where the plurality of clamping ends 24 exert the pressure towards the substrate mounting plate 6. When the sealing element is in the form of the seal ring 64, a plurality of seal rings 64 can be disposed at different positions from the side of the hole 65. When the sealing element is in the form of the gasket, the plurality of clamping ends 24 can apply the pressure at different positions of the gasket from the side of the hole 65.

It should be noted that although the sealing element is in the form of the seal ring 64 in FIGS. 11 and 12, the present disclosure is not limited thereto. As described above, the sealing element can also adopt the form of the gasket. When the supporting plate 21 is at the parallel position, an orthographic projection of the position where the clamping end 24 of the supporting plate 22 exerts the pressure towards the substrate mounting plate 6 on the substrate mounting plate 6 falls within an orthographic projection of the gasket on the substrate mounting plate 6.

The plating apparatus further comprises a plating solution drive device 8 disposed in the tank body 1. As illustrated in FIG. 1, the plating solution drive device 8 is set to face the opening 15 on the side wall S and configured to drive the plating solution L to flow towards the opening 15. Thus, the plating solution L near the substrate 3 can be rapidly replenished, the parameters such as temperature, concentration, pH and the like of the plating solution L in the vicinity of the substrate 3 remains constant, and the chemical composition of the plating solution L is uniformly dispersed. Therefore, the coating deposited on the substrate 3 can be formed in a uniform thickness to improve the yield of plating treatment and reduce the production cost.

Figure 13:
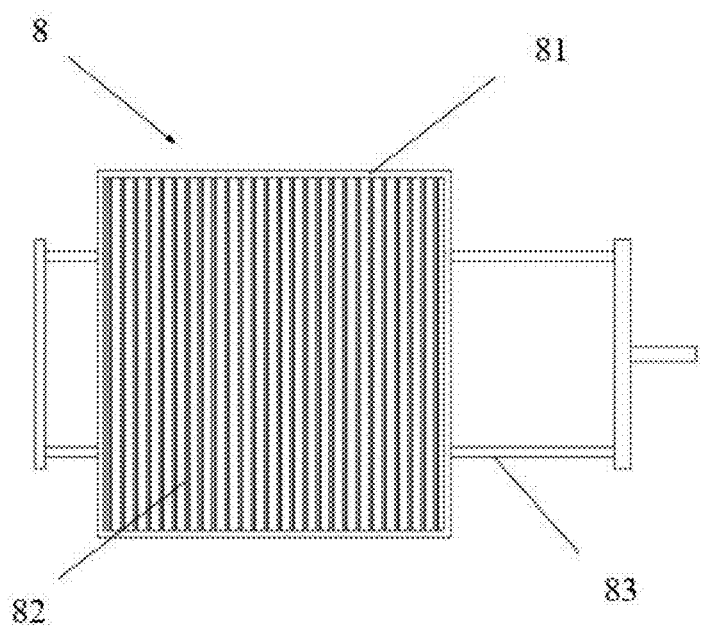
FIG. 13 is a schematic diagram of a plating solution drive device in another embodiment of the present disclosure.

According to one embodiment of the present disclosure, as illustrated in FIG. 13, the plating solution drive device 8 comprises a connecting frame 81 and a plurality of blades 82 connected to the connecting frame 81, and the plurality of blades 82 are, for instance, formed as mutually parallel grids. The connecting frame 81 and the plurality of blades 82 are arranged in a plane parallel to the side wall S provided with the opening 15 (as illustrated in FIG. 1). The connecting frame 81 can be connected to a drive device via a slide bar 83. The drive device can drive the connecting frame 81 and the plurality of blades 82 to move in a plane parallel to the side wall S, for instance, performing reciprocating movement along the horizontal direction or the vertical direction, thereby driving a flow of the plating solution L in the vicinity of the substrate 3.

Figure 14:
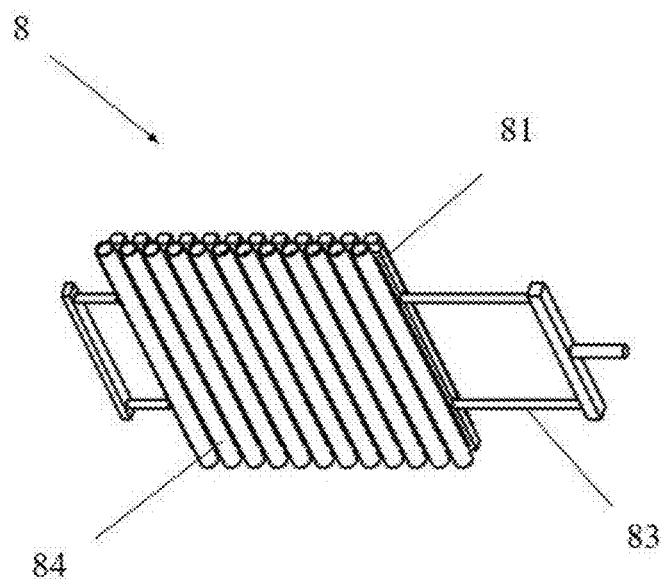
FIG. 14 is a schematic diagram of a plating solution drive device in one embodiment of the present disclosure.

According to another embodiment of the present disclosure, as illustrated in FIG. 14, the plating solution drive device 8 comprises a connecting frame 81 and a plurality of ducts 84 connected to the connecting frame 81. The plurality of ducts 84 are juxtaposed in the plane parallel to the side wall S provided with the opening 15. A plurality of nozzles (not illustrated) are disposed on each duct 84 in an equidistant manner, and are open towards the side walls S provided with the openings 15. Thus, the plurality of nozzles can be arranged in an array in the plane parallel to the side wall S provided with the opening 15. During the plating process, the plating solution L can flow in the duct 84 and be sprayed towards the substrate 3 disposed on the opening 15 of the side wall S through the nozzles. The connecting frame 81 can be connected to the drive device via the slide bar 83. The drive device can drive the connecting frame 81, the plurality of ducts 84, and the plurality of nozzles to move in the plane parallel to the side wall S, for instance, performing reciprocating movement along the horizontal direction or the vertical direction, so as to uniformly spray the plating solution L onto the surface to be plated of the substrate 3.

According to another embodiment of the present disclosure, the plating solution drive device 8 can comprise both a plurality of blades 82 and a plurality of ducts 84 provided with nozzles. In this configuration, the movement of the blades 82 and the spraying action of the nozzles can produce a collaborative effect to better drive the flow of the plating solution with a view to form a uniform coating.

In some examples, the distance between adjacent nozzles is in a range from 1 mm to 5 mm, e.g., 1.5 mm. The bore diameter of the nozzle is in a range from 0.5 mm to 1 mm, e.g., 0.8 mm.

In order to obtain a coating with more uniform thickness, the plating solution drive device 8 can be arranged as close as possible to the side wall S provided with the opening 15. For instance, the distance between the plating solution drive device 8 and the side wall can be in a range from 2 mm to 4 mm.

Figure 15:
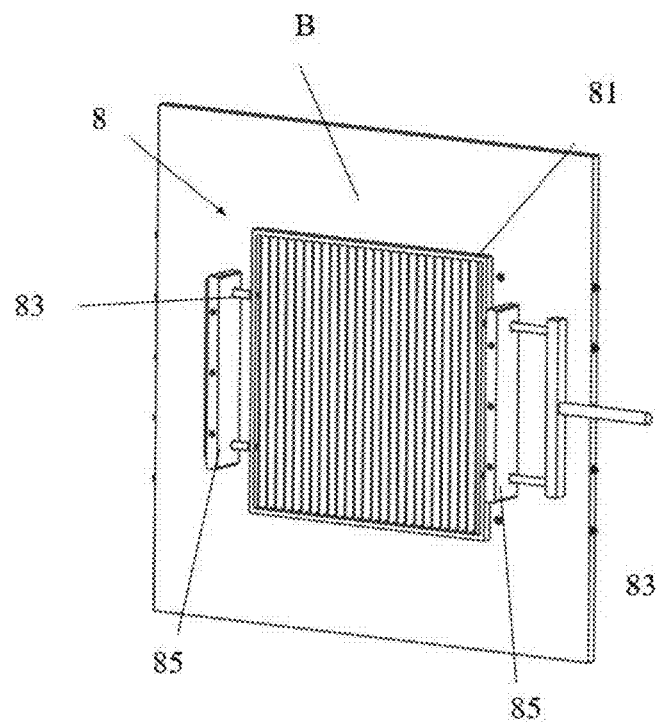
FIG. 15 is a schematic diagram of a plating solution drive device mounted to a side wall in one embodiment of the present disclosure.

In some examples, the plating solution drive device 8 can be mounted to the side wall S provided with the opening 15. In the embodiment as illustrated in FIG. 15, holders 85 for the plating solution drive device 8 can be disposed on the inner side of the side wall S. The holder 85 is roughly perpendicular to the side wall S and protrudes towards the inside of the tank body 1. The holders 85 are arranged on both sides of the plating solution drive device 8. The holders 85 can be provided with a through hole, and the slide bar 83 of the plating solution drive device 8 can be inserted into and supported by the through hole. The holders 85 have the dual function of holding the plating solution drive device 8 and guiding the movement of the plating solution drive device 8. Due to this configuration, the movement process of the plating solution drive device 8 can be implemented in a more stable manner, and the distance from the plating solution drive device 8 to the substrate to be plated 3 can be accurately controlled.

The operation method of the plating apparatus will be described below and is used for performing plating treatment on the substrate to be plated 3.

Firstly, placing the substrate 3 on the outer side of the side wall and at the position of the opening, and operating the fixing device 20 to fix the substrate 3.

In some examples, the plating apparatus 1 comprises a substrate mounting plate 6 fixed to the outer side of the side wall, the substrate mounting plate 6 comprises a hole 65 and a substrate mounting area 6A arranged around the hole 65, and the position of the hole 65 corresponds to the position of the opening. In this case, the step of operating the fixing device 20 to fix the substrate 3 further comprises: operating the fixing device 20 to fix the substrate 3 to the substrate mounting plate 6.

In some examples, the substrate mounting area 6A is provided with electrical contacts 66 configured to be electrically connected with the substrate 3, and the plating apparatus 1 further comprises a resistance measuring device electrically connected to the electrical contacts 66. In this case, the step of operating the fixing device 20 to fix the substrate 3 further comprises: using the resistance measuring device to measure the contact resistance between the substrate 3 and the electrical contacts 66, and determining the connection status of the substrate 3 and the electrical contacts 66.

Secondly, performing plating treatment on the substrate 3.

In some examples, performing plating treatment on the substrate 3 can comprise: injecting the plating solution into the tank body 1, so that the plating solution can contact at least a part of the substrate 3, and applying a cathode voltage to the substrate 3 through the electrical contacts 66, applying an anode voltage to the anode of the plating apparatus 1, and then performing plating treatment on the substrate 3.

In some examples, the plating apparatus 1 comprises a plating solution drive device 8 being disposed in the tank body 1 and facing the opening, and the plating solution drive device 8 is configured to drive the plating solution to flow towards the opening. In this case, the step of performing plating treatment on the substrate 3 can comprise: using the plating solution drive device 8 to drive the plating solution to flow towards the substrate 3.

Figure 16:
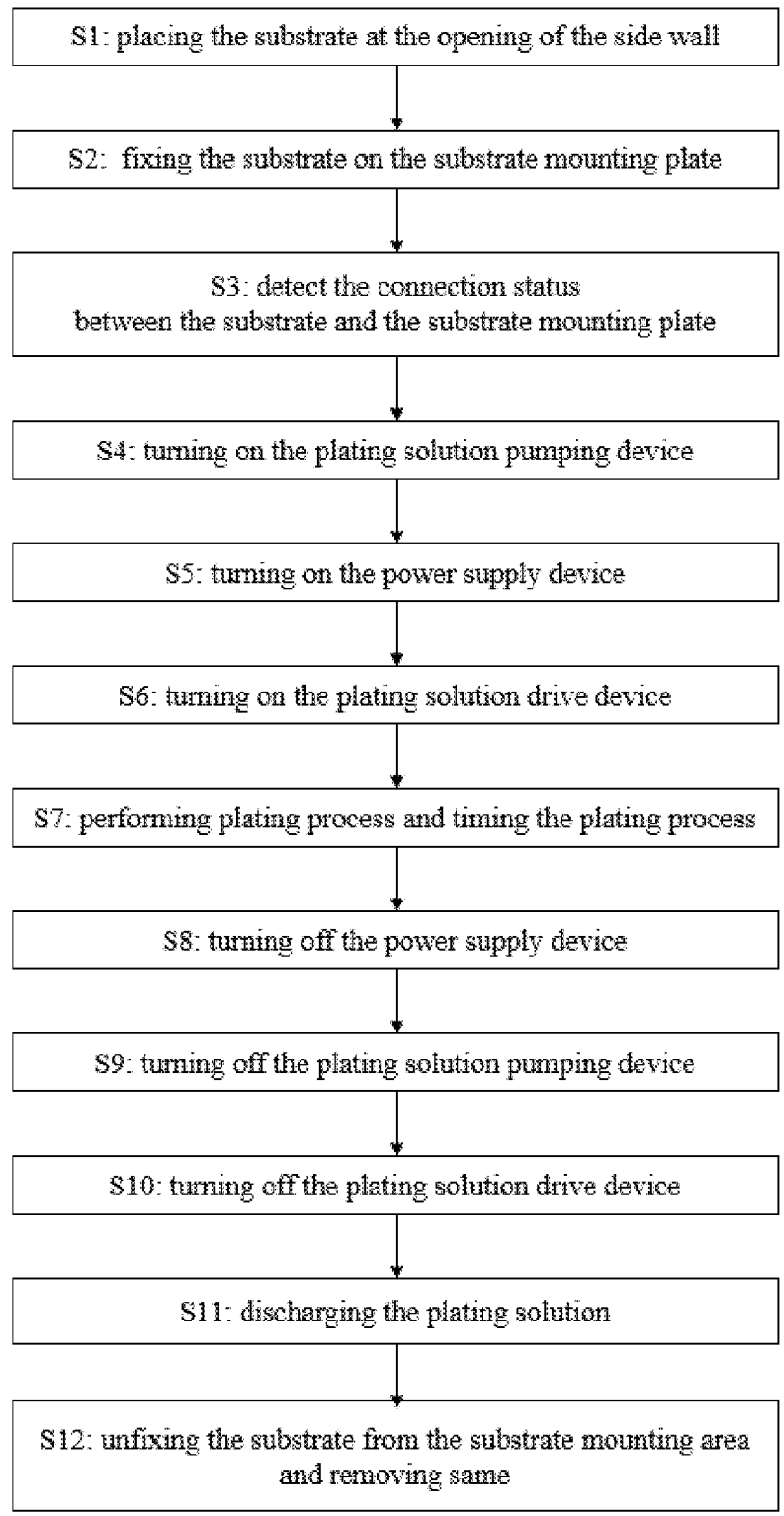
FIG. 16 is a schematic diagram of an operation method of the plating apparatus, provided by one embodiment of the present disclosure.

FIG. 16 illustrates an operation method of the plating apparatus 1 provided by one embodiment of the present disclosure. The method comprises:

S1: placing the substrate 3 on the outer side of the side wall S and at the position of the opening 15; and S2: operating the fixing device 2 to fix the substrate 3 on the substrate mounting plate 6.

For instance, the first driving mechanism 71 is operated at first so that the clamping plate 22 can move from the retraction position to the extension position and the clamping end 24 of the clamping plate 22 can move to the position above the substrate mounting area 6A, and then the second driving mechanism 72 is operated so that the supporting plate 21 can rotate from the inclination position to the parallel position and the clamping end 24 of the clamping plate 22 can apply a pressure to the substrate 3 in the substrate mounting area 6A.

S3: utilizing the resistance measuring device to detect the connection status between the substrate 3 and the substrate mounting plate 6.

S4: turning on a plating solution pumping device 8 to inject the plating solution L into the tank body 1 and allow the plating solution L to contact at least a part of the substrate 3.

S5: turning on the power supply device 5 to apply a voltage between the substrate to be plated 3 and the anode 4.

S6: turning on the plating solution drive device 8 to perform a reciprocating motion in the plane parallel to the substrate 3, and drive the plating solution L to flow towards the surface to be plated of the substrate 3.

S7: performing the plating process and timing the plating process.

S8: turning off the power supply device 5.

S9: turning off the plating solution pumping device, and stopping injecting the plating solution into the tank body 1.

S10: turning off the plating solution drive device 8.

S11: discharging the plating solution from the tank body 1.

S12: operating the fixing device 2 to unfix the substrate 3 from the substrate mounting area 6A and detach the substrate 3 from the substrate mounting plate 6.

Further features of the present disclosure may be found in the claims, the drawings, and the description of the drawings. The features and combinations of features mentioned above in the description and the features and combinations of features which are further illustrated in the drawings and/or independently illustrated in the drawings are not only used for the respectively indicated combinations, but also for other combinations or for individual use, without departing from the scope of the present disclosure. The details of the present disclosure, which are not explicitly illustrated and explained in the drawings but are presented from the detailed description of the features through independent feature combinations are thus comprised and disclosed. Therefore, details and combinations of features that do not have all of the features of the originally formed independent claims should also be considered as disclosed.

The application claims priority to the Singapore patent application No. 10201902611P, filed on 22 Mar. 2019 and the China patent application No. 201910391509.6, filed on Oct. 5, 2019, the entire disclosure of which are incorporated herein by reference as part of the present application.

The invention claimed is:

1. A plating apparatus for performing plating treatment on a substrate, comprising:
    a tank body comprising at least one side wall, the at least one side wall being provided with an opening extending from the inside to the outside of the tank body, the tank body being configured to accommodate a plating solution;
    a fixing device configured to fix the substrate at the opening of the side wall; and
    a plating solution drive device disposed in the tank body and facing the opening, comprising a plurality of blades arranged and configured to move in a plane parallel to the side wall provided with the opening to drive the plating solution to flow towards the opening,
    wherein the plating solution drive device is mounted on the side wall provided with the opening and a distance between the plating solution drive device and the side wall provided with the opening is in a range from 2 mm to 4 mm.

2. The plating apparatus according to claim 1, further comprising a substrate mounting plate fixed on an outer side of the side wall,
    wherein the substrate mounting plate is provided with a hole and a substrate mounting area arranged around the hole; and a position of the hole of the substrate mounting plate corresponds to a position of the opening of the side wall.

3. The plating apparatus according to claim 2, wherein the fixing device is disposed on the substrate mounting plate.

4. The plating apparatus according to claim 2, wherein the fixing device comprises at least one clamping piece; and at least a part of the clamping piece is configured to move between a side of the substrate mounting area away from the hole and the substrate mounting area and to apply a pressure towards the substrate mounting area.

5. The plating apparatus according to claim 4, wherein the fixing device comprises a first driving mechanism and a second driving mechanism;
    wherein the first driving mechanism is configured to drive at least a part of the clamping piece along a first direction, so that the at least a part of the clamping piece moves from the side of the substrate mounting area away from the hole to the substrate mounting area, the first direction is parallel to the substrate mounting plate and directed from the side of the substrate mounting area away from the hole to the substrate mounting area; and
    wherein the second driving mechanism is configured to drive at least a part of the clamping piece along a second direction perpendicular to the substrate mounting plate, so that the at least a part of the clamping piece applies the pressure towards the substrate mounting area.

6. The plating apparatus according to claim 5, wherein the clamping piece comprises a supporting plate and a clamping plate, the supporting plate comprises a receiving slot, the clamping plate is inserted into the receiving slot and capable of sliding in the receiving slot along the first direction;
    wherein the first driving mechanism is configured to drive the clamping plate along the first direction, so that the clamping plate extends out of the receiving slot and moves from the side of the substrate mounting area away from the hole to the substrate mounting area; and
    wherein the second driving mechanism is configured to drive the clamping plate along the second direction so that the clamping plate applies the pressure towards the substrate mounting area.

7. The plating apparatus according to claim 6, wherein the fixing device further comprises a pivotal shaft connected to a middle part of the supporting plate; the second driving mechanism is configured to drive an end portion of the supporting plate away from the hole in the first direction to move away from the substrate mounting plate along the second direction, so that the supporting plate rotates about the pivotal shaft, an end portion of the supporting plate close to the hole in the first direction moves towards the substrate mounting plate along the second direction, and the clamping plate applies the pressure towards the substrate mounting area.

8. The plating apparatus according to claim 7, wherein the clamping plate comprises a cantilever element and a clamping end, the cantilever element is configured to be inserted into the receiving slot of the supporting plate, and the clamping end extends from an end of the cantilever element towards the substrate mounting plate and is configured to apply the pressure towards the substrate mounting plate; and
    wherein in a case that the supporting plate is parallel to the substrate mounting plate, a first distance between the pivotal shaft and the second driving mechanism measured in the first direction is greater than a second distance between the pivotal shaft and the clamping plate measured in the first direction.

9. The plating apparatus according to claim 1, wherein the plating solution drive device comprises a plurality of nozzles arranged in an array and configured to move in a plane parallel to the side wall provided with the opening, and the plurality of nozzles are further configured to spray the plating solution towards the side wall provided with the opening.

10. The plating apparatus according to claim 9, wherein a distance between adjacent nozzles is in a range from 1 mm to 5 mm, and the nozzle has a bore diameter in a range from 0.5 mm to 1 mm.

11. The plating apparatus according to claim 2, further comprising at least one sealing element disposed in at least one of the following areas: an area of the substrate mounting plate around the hole or an area of the side wall, provided with the opening, around the opening.

12. The plating apparatus according to claim 5, wherein the clamping plate comprises a cantilever element and a clamping end, the cantilever element is configured to be inserted into the receiving slot of the supporting plate, and the clamping end extends from an end of the cantilever element towards the substrate mounting plate and is configured to apply the pressure towards the substrate mounting plate; and wherein the plating apparatus comprises at least one sealing element disposed in at least one of the following areas: an area of the substrate mounting plate around the hole or an area of the side wall, provided with the opening, around the opening, and a position at which the clamping end applies the pressure towards the substrate mounting plate at least partially overlaps with a position of the sealing element in the direction perpendicular to the substrate mounting plate.

13. The plating apparatus according to claim 12, wherein the clamping plate comprises a plurality of clamping ends, and positions at which the plurality of clamping ends apply the pressure towards the substrate mounting plate are at least partially overlapped with the position of the sealing element in the direction perpendicular to the substrate mounting plate.

14. The plating apparatus according to claim 2, wherein the substrate mounting area is provided with electrical contacts configured to be electrically connected with the substrate and the electrical contacts are distributed on two opposite sides or four sides of the hole of the substrate mounting plate.

15. The plating apparatus according to claim 14, further comprising a resistance measuring device electrically connected to the electrical contacts of the substrate mounting area, wherein a number of the electrical contacts distributed on each side of the hole is four or more.

16. The plating apparatus according to claim 1, further comprising an anode disposed in the tank body.

17. A plating apparatus for performing plating treatment on a substrate, comprising:
    a tank body comprising at least one side wall, the at least one side wall being provided with an opening extending from the inside to the outside of the tank body, the tank body being configured to accommodate a plating solution;
    a fixing device configured to fix the substrate at the opening of the side wall; and
    a substrate stopper which is configured to move from the outside of the opening to a middle part of the opening.

18. A method for performing a plating treatment on a substrate, comprising the steps of:
    (i) providing the plating apparatus according to claim 17;
    (ii) placing the substrate on an outer side of the side wall and at a position of the opening, and operating the fixing device to fix the substrate; and
    (iii) performing a plating treatment on the fixed substrate.

19. The plating apparatus according to claim 17, further comprising a substrate mounting plate fixed on an outer side of the side wall,
    wherein the substrate mounting plate is provided with a hole and a substrate mounting area arranged around the hole; and a position of the hole of the substrate mounting plate corresponds to a position of the opening of the side wall.

20. The plating apparatus according to claim 19, wherein the substrate stopper further comprises a supporting stand connected to the substrate mounting plate and an arm substantially parallel to the substrate mounting plate.

* * * * *